US006215333B1

United States Patent
Kuttner

(12) United States Patent
(10) Patent No.: US 6,215,333 B1
(45) Date of Patent: Apr. 10, 2001

(54) COMPARATOR FOR A WIDE SUPPLY VOLTAGE RANGE

(75) Inventor: Franz Kuttner, St. Ulrich (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/049,394

(22) Filed: Mar. 27, 1998

(30) Foreign Application Priority Data

Mar. 27, 1997 (DE) ................................ 197 13 144

(51) Int. Cl.$^7$ ................................ H03K 5/24; H03F 3/45
(52) U.S. Cl. ................................ 327/67; 327/89; 327/563; 330/260
(58) Field of Search ................................ 327/52, 67, 87, 327/89, 95, 561, 562, 563; 330/260

(56) References Cited

U.S. PATENT DOCUMENTS

| 4,924,116 | * | 5/1990 | Vu et al. ................................ 326/32 |
| 5,075,582 | * | 12/1991 | Bichler ................................ 327/557 |
| 5,113,090 | | 5/1992 | Imaizumi et al. ................................ 327/69 |
| 5,311,319 | * | 5/1994 | Monoi ................................ 327/73 |
| 5,362,995 | | 11/1994 | Kubo ................................ 327/65 |
| 5,565,800 | * | 10/1996 | Kobayashi ................................ 327/65 |

FOREIGN PATENT DOCUMENTS

| 0407859B1 | 1/1991 | (EP) ................................ H03K/5/22 |
| 0523380A2 | 1/1993 | (EP) ................................ H03K/5/24 |
| 0619647A1 | 10/1994 | (EP) ................................ H03F/3/45 |

OTHER PUBLICATIONS

"CMOS Analog Circuit Design," Phillip E. Allen et al., Holt, Rinehart and Winston, Inc., New York, Chicago, 1987, p. 364.
"Analog MOS Integrated Circuits for Signal Processing", Roubik Gregorian et al., John Wiley & Sons, New York, Cichester, Brisbane, Toronto, Singapore. 1986, pp. 424–437.
"Design Techniques for High–Speed, High–Resolution Comparators", Behzad Razavi et al., IEEE Journal of Solid–State Circuits, vol. 27, No. 12, Dec. 1992, pp. 1916–1926.
"A Precision Variable–Supply CMOS Comparator", David. J. Allstot, IEEE Journal of Solid–State Circuits, vol. SC–17, No. 6, Dec. 1982, pp. 1080–1087.
Japanese Patent Abstract No. 06059079 (Yoshikazu), dated Oct. 20, 1995.

* cited by examiner

*Primary Examiner*—Timothy P. Callahan
*Assistant Examiner*—Terry L. Englund
(74) *Attorney, Agent, or Firm*—Herbert L. Lerner; Laurence A. Greenberg; Werner H. Stemer

(57) ABSTRACT

A comparator is operable within a wide supply voltage range. A source follower is connected at the output side of a differential amplifier stage, and a switch closes a feedback loop from the source follower to the differential amplifier stage. A diode, which has the same conductivity type as the conductivity type of the transistor used as the switch, is provided in order to set the operating point of the differential amplifier stage.

3 Claims, 2 Drawing Sheets

COMPARATOR FOR A WIDE SUPPLY VOLTAGE RANGE

BACKGROUND OF THE INVENTION

Field of the Invention

The present invention relates to a comparator for a wide supply voltage range, in which a source follower is connected downstream of a differential amplifier stage, and a switch closes a feedback loop from the source follower to the differential amplifier stage.

A known use of comparators in electronics is for decoding whether a voltage is larger or smaller than a comparative voltage. Thus, for example, A/D converters based on the principle of successive approximation use multistage comparators as shown schematically in FIG. 2 in which comparator stages 1 are connected in series via capacitors 2. During a sample phase, feedback switches 3, which bridge the individual comparator stages 1, are closed while an input voltage uin is applied to an input 4. The offset value for the individual comparator stages 1 and the voltage uin to be measured are stored in the capacitors 2. In the course of such operation, each individual stage sets its own operating point, while the gain has the value zero because the comparators are bridged by means of the switches 3.

At a sample instant, all the feedback switches 3 are then opened and a comparative voltage ref is added to the input 4. Each comparator stage 1 thus amplifies the difference between the voltages uin and ref by a factor of approximately 10. By this means, a small difference at the input 4 encounters a voltage level which can be processed by a downstream logic configuration at an output 5 of the last comparator stage 1.

Such multistage comparators are described, for example, in IEEE Journal of Solid-State Circuits, Vol. SC-17, No. 6, Dec. 7, 1982; Vol. 27, No. 12, December 1992; and in European patent 0407859 B1.

The individual stages of the comparator shown in FIG. 2 have hitherto been designed as a differential amplifier stage with a downstream source follower, as shown in FIG. 3. Thus, in FIG. 3 a differential amplifier stage 6 is connected at the input and the output to a source follower 7. In such a circuit configuration, it has been shown that the current which is mirrored in at a reference ground point 8 of the differential amplifier 6 is about 20% larger than the sum of the currents which are impressed by two upper current sources 9. The remaining 20% of the current is taken by two PMOS diodes 10.

The structure of the circuit configuration of in FIG. 3 was developed from a simple differential stage, as shown in FIG. 4.

The problem of such a differential amplifier is the switches 3 which are used to close a feedback loop for the differential amplifier 6.

The reason for this is that in A/D converters operating on the principle of successive approximation—explained above with reference to FIG. 2—it has to be assumed that a positive or negative voltage step change of at least half the comparative voltage ref can occur during the conversion at the input of a comparator stage 1. With an input voltage uin of VDD=5 V and a comparative voltage ref where Vref=5 V, the comparator must be able to process a step change of 2.5 V at the input 4. In the case of the differential amplifier 6, the operating point of a node a1 or a node q1 after offset adjustment is at approximately 3.8 V, that is to say the difference between the voltage VDD and the threshold voltage of the PMOS diode 10. That operating point is held firmly by the PMOS diode 10.

If a PMOS transistor is used for the switch 3, a positive voltage step change at the input 4 then becomes the problem because the diodes 100 at the source and drain of the transistor (switch 3) are turned on, as shown schematically in FIG. 5. Consequently, charge flows away from a node e1 after the positive or negative voltage step change until the potential at the node e1 is smaller than the sum of the voltage VDD and the diode forward voltage. Subsequent comparator decisions therefore become incorrect with successive approximation, so that the conversion result is no longer correct either.

If an NMOS transistor is used for the switch 3, this problem of a voltage step change does not occur because the diodes 100 can become active only toward ground voltage VSS. This, however, in turn causes problems with a substrate control effect of the NMOS transistor used as the switch 3.

In such a circuit shown in FIG. 6, the semiconductor body (bulk) of the switch 3 is at ground voltage VSS, while the source and drain have the difference between the voltage VDD and a threshold value voltage Vth applied to them. Under these conditions, the switch 3 has a high impedance even if 5 V is applied to its gate terminal.

In order then to solve these switch problems, the source follower 7 has hitherto been connected downstream of the differential amplifier 6, and the sample phase has been fed back via the two stages, that is to say the differential amplifier 6 and the source follower 7. As a result of this source follower 7, the operating point at the node e1 and/or e1q is lower than the voltage at the node a1 and/or at the node q1 by the threshold value voltage Vth.

It follows that, if the comparator is to operate satisfactorily within a wide supply voltage range, there is little use for a circuit configuration with a downstream source follower 7.

In an A/D converter for a cordless telephone (DECT system), battery operation may cause the operating voltage VDD to fluctuate between 2.8 V and 5.4 V. The solution using a downstream source follower 7 cannot be applied satisfactorily here, since the PMOS diode 10, the source follower and the input transistors of the differential amplifier 6 mean that three transistors are connected between the voltage VDD and the voltage VSS, as shown in FIG. 7.

With the threshold voltages of approx. 1 V provided by this technology for the individual transistors, as much as 3 V overall are thus required for these transistors. Furthermore, an additional 0.5 V or so for the current source at the reference ground point 8 of the differential amplifier 6 should be available. It is therefore not possible to operate such a comparator at a supply voltage of about 2.8 V.

SUMMARY OF THE INVENTION

It is accordingly an object of the invention to provide a comparator for a wide supply voltage range, which overcomes the above-mentioned disadvantages of the prior art devices and methods of this general type and which requires as little threshold voltage as possible between the operating voltage and the ground voltage in order to set the operating point.

With the foregoing and other objects in view there is provided, in accordance with the invention, a comparator for a wide supply voltage range, comprising:

a differential amplifier stage and a source follower connected downstream of the differential amplifier stage;

a feedback loop connected between the source follower and the differential amplifier stage, and a transistor switch of a given conductivity type connected in the feedback loop from the source follower to the differential amplifier stage; and a diode of the given conductivity type connected to set an operating point of the differential amplifier stage.

In other words, the objects of the invention are satisfied in that the prior art comparator of the above-mentioned type is provided with a diode which has the same conductivity type as the conductivity type of the transistor which is used as the switch and whereby the diode sets the operating point of the differential amplifier stage.

In accordance with an added feature of the invention, the diode is an NMOS diode. The NMOS diode is expediently connected between the gate of the source follower transistor and the gate of an output transistor in the differential amplifier stage.

In accordance with a concomitant feature of the invention, the diode is connected between the gate of the source follower transistor and a supply voltage.

In order that the substrate control effect does not cause the NMOS transistor (the switch) to have a high impedance in the sample phase, the operating point at the nodes a1 and q1 is thus no longer determined by a PMOS diode. Instead, the NMOS diode used has the advantage that the substrate control effect has the same effect here as it has on the switch. As the supply voltage rises, the operating point therefore does not rise as sharply as the voltage VDD. As the supply voltage rises, the voltage drop across the NMOS diode increases as a result of the substrate control effect. As long as the NMOS diode is in the on state, therefore, the transistor operating as a switch additionally has a low enough impedance because the same potentials are present at both components in the feedback phase. At low supply voltages, a transistor or a threshold value voltage between the voltages VDD and VSS is thus dispensed with, so that the comparator can operate satisfactorily at voltages VDD down to approx. 2.5 V.

Source followers are connected downstream of the differential amplifier stage and they drive the capacitive load of the coupling capacitor for the next stage. The offset of these source followers is no longer compensated for in the amplifier stage itself, since the source followers are no longer in the feedback loop. However, in the circuit configuration described, an offset obtained at the output of one stage is stored, in the feedback phase, in the capacitors for the next stage and compensated for thereby.

Other features which are considered as characteristic for the invention are set forth in the appended claims.

Although the invention is illustrated and described herein as embodied in a comparator for a wide supply voltage range, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
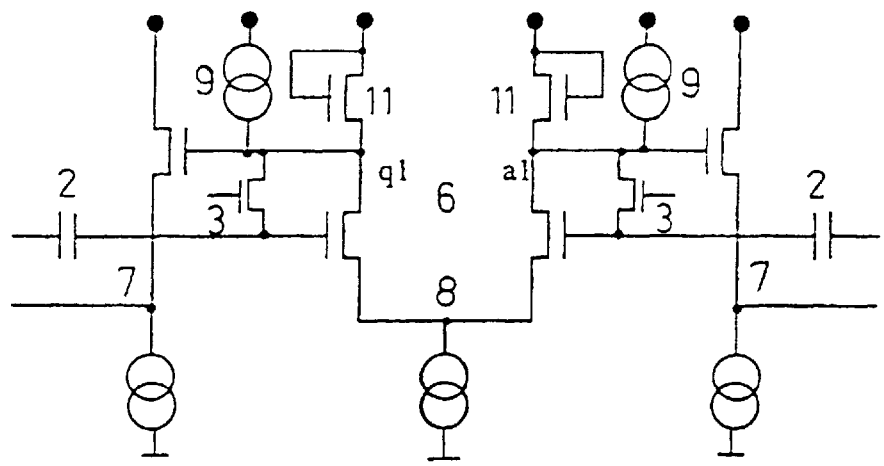
FIG. 1 is a circuit diagram showing the comparator according to the invention.
Figure 2:
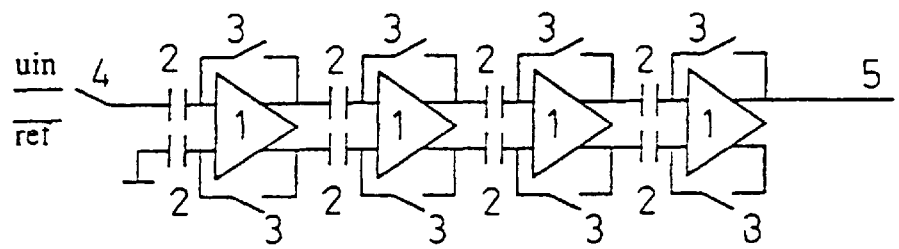
FIGS. 2 to FIG. 7 are various circuit diagrams for explaining prior art comparators.

Referring now to FIG. 1 of the drawing in detail, the components illustrated therein are referenced with the same reference symbols as the prior art circuits illustrated in FIGS. 2 to 7.

Figure 3:
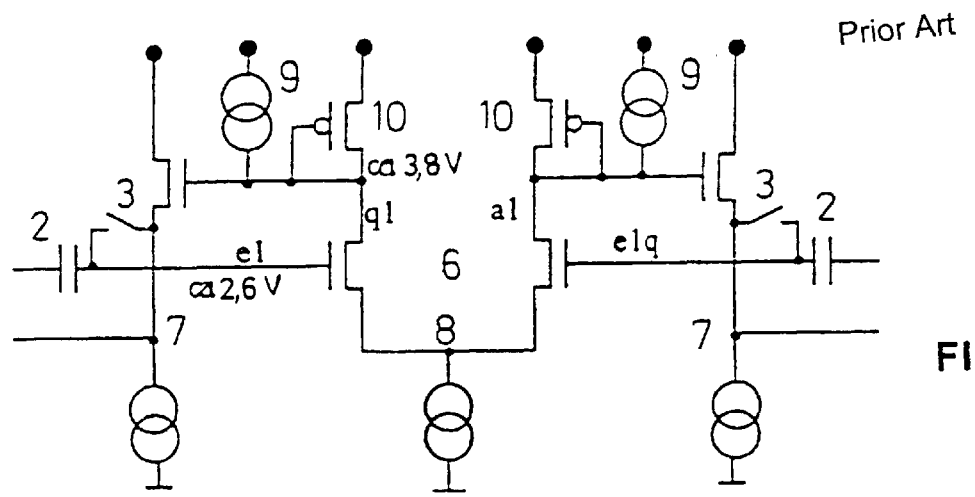
Figure 4:
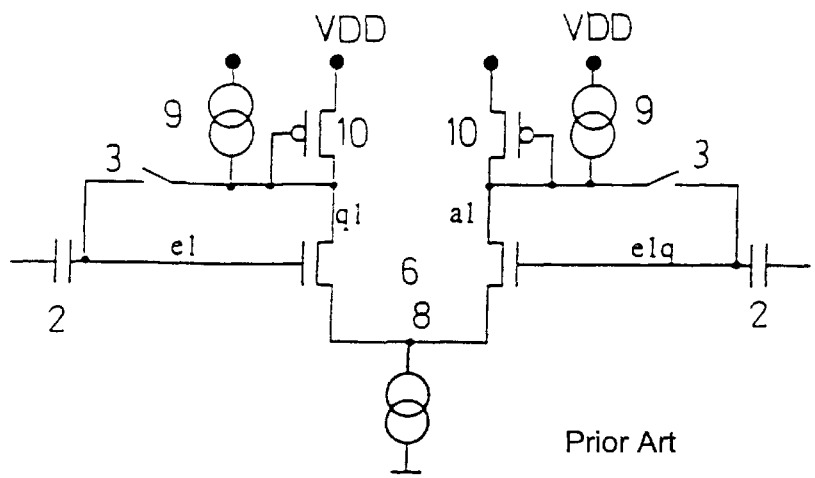
Figure 5:
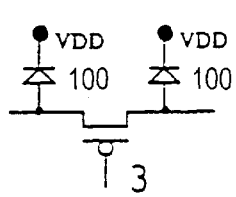
Figure 6:
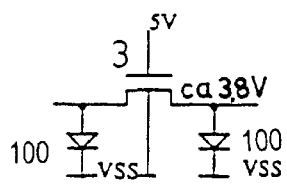
Figure 7:
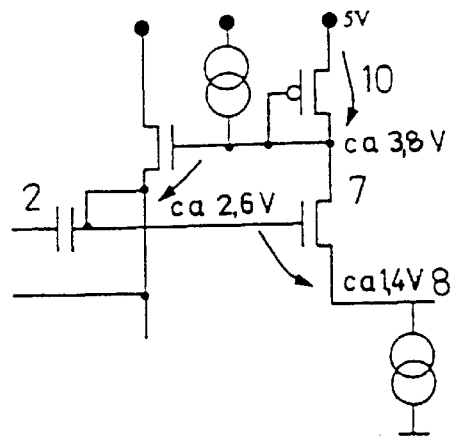

In the novel comparator, the operating point at the nodes a1 and q1 is no longer determined by a PMOS diode, as in the circuit configuration of FIG. 3, but by an NMOS diode 11. This has the advantage that the substrate control effect acts in the same way as in the case of the NMOS transistor used as a switch 3. As the supply voltage VDD rises, the operating point therefore no longer rises as sharply as the supply voltage. Instead, the voltage drop across the NMOS diode 11 increases as a result of the substrate control effect. As long as the NMOS diode 11 is in the on state, therefore, then the NMOS transistor used as the switch 3 also has a low enough impedance because the same potentials are present at both components, that is to say the NMOS diode and the NMOS transistor.

At low supply voltages, this means that a transistor or a threshold value voltage between the voltages VDD and VSS can be dispensed with, so that the operation of the comparator is guaranteed down to voltages of 2.5 V.

As in the existing circuit configuration of FIG. 3, a source follower 7 is also connected downstream of the differential amplifier 6 and drives the capacitive load of the coupling capacitor 2 for the next stage. The offset of the source follower 7 is no longer compensated for in the very same stage, however, since the source follower 7 is no longer in the feedback loop. Instead, in the novel comparator, an offset obtained at one stage is stored, in the feedback phase, in the capacitors 2 for the next stage and compensated for thereby.

I claim:

1. A comparator for a wide supply voltage range, comprising:

a differential amplifier stage having a transistor with an input and an output and being of a first conductivity type;

a source follower having a gate and being connected downstream of said differential amplifier stage;

at least one MOS-transistor for providing feedback, having a drain and a source, and being of the first conductivity type; and a diode being of the first conductivity type and connected to set an operating point of said differential amplifier stage;

said gate of said source follower connected to said input of said transistor of said differential amplifier stage via said source and said drain of said at least one MOS-transistor, and said gate of said source follower also connected to said output of said transistor of said differential amplifier stage.

2. The comparator according to claim 1, wherein said diode is an NMOS diode.

3. The comparator according to claim 1, wherein said source follower is a source follower transistor with a gate, said gate of said source follower transistor defines said gate of said source follower, and said diode is connected between said gate of said source follower transistor and a supply voltage.

* * * * *